(12) United States Patent
Igawa et al.

(10) Patent No.: US 6,933,100 B2
(45) Date of Patent: Aug. 23, 2005

(54) METHOD OF FORMING A MINUTE RESIST PATTERN

(75) Inventors: Akihiko Igawa, Shizuoka (JP); Jun Ikemoto, Shizuoka (JP)

(73) Assignee: Clariant Finance (BVI) Limited, Tortola (VG)

(*) Notice: Subject to any disclaimer, the term of this patent is extended or adjusted under 35 U.S.C. 154(b) by 380 days.

(21) Appl. No.: 10/323,119

(22) Filed: Dec. 18, 2002

(65) Prior Publication Data

US 2003/0108822 A1 Jun. 12, 2003

Related U.S. Application Data

(62) Division of application No. 09/555,393, filed on Aug. 1, 2000, now Pat. No. 6,514,676.

(51) Int. Cl.$^7$ .............................. G03F 7/30; G03F 7/023
(52) U.S. Cl. ....................... 430/326; 430/192; 430/193; 430/331
(58) Field of Search ................................ 430/326, 192, 430/193, 331

(56) References Cited

U.S. PATENT DOCUMENTS

| | | | |
|---|---|---|---|
| 3,666,473 A | 5/1972 | Colom | 96/91 D |
| 4,115,128 A | 9/1978 | Kita | 96/91 D |
| 4,173,470 A | 11/1979 | Fahrenholtz et al. | 430/5 |
| 4,914,006 A | 4/1990 | Kato et al. | 430/331 |
| 5,087,548 A * | 2/1992 | Hosaka et al. | 430/192 |
| 5,629,127 A | 5/1997 | Oosedo et al. | 430/191 |
| 5,645,970 A * | 7/1997 | Cheng et al. | 430/192 |
| 6,514,676 B1 * | 2/2003 | Igawa et al. | 430/192 |

OTHER PUBLICATIONS

English abstract for JP 61070551, Apr. 11, 1986.
English abstract for JP 61151537, Jul. 10, 1986.
English abstract for JP 61232454, Oct. 16, 1986.
English abstract for JP 62032454, Feb. 12, 1987.
English abstract for JP 62232453, Oct. 12, 1987.
English abstract for JP 5127375, May 25, 1993.
English abstract for JP 7098506, Apr. 11, 1995.

* cited by examiner

*Primary Examiner*—John S. Chu
(74) *Attorney, Agent, or Firm*—Sangya Jain

(57) ABSTRACT

A method of forming a minute resist pattern wherein a positive-working photoresist composition containing 3 to 15 parts by weight of a quinone diazide group-containing photosensitizer relative to 100 parts by weight of alkali-soluble novolak resin is developed by an aqueous organic or inorganic alkali solution having a lower alkali concentration than that of the conventional one as the developer. The preferable example of the organic alkali materials in the developer is quaternary ammonium hydroxide, and the preferable example of the inorganic alkali materials in the developer is alkali metal hydroxide. The concentrations of the quaternary ammonium hydroxide and the alkali metal hydroxide in the developing solution are 2.2% by weight or less and 0.4% by weight or less respectively. Using such developing solution, high sensitivity, a high film retention rate, high resolution, low process dependency of dimension accuracy, and a formation of excellent pattern profile can be achieved.

6 Claims, No Drawings

METHOD OF FORMING A MINUTE RESIST PATTERN

This application is a Divisional application of application Ser. No. 09/555,393 filed on Aug. 1, 2000 now U.S. Pat. No. 6,514,676, the contents of which is hereby incorporated by reference.

TECHNICAL FIELD

The present invention relates to a method of forming a minute resist pattern wherein a resist pattern with high sensitivity, high resolution, and an excellent film retention rate can be obtained by use of a positive-working photoresist composition.

BACKGROUND ART

Heretofore, a method of forming a minute resist image on a substrate by applying a positive-working photoresist composition to a substrate to form a resist film, exposing it with radiation such as UV rays, deep UV rays, X rays and electron beams and then developing the resist film, that is, the formation of a minute resist pattern by the photolithography method is well-known. In this photolithography method using the positive-working photoresist composition, 2.38 to 2.50 weight % aqueous tetramethyl ammonium hydroxide or 0.50 weight % or more aqueous sodium hydroxide or potassium hydroxide is used as the developing solution. On the other hand, as the positive-working photoresist composition, a composition comprising an alkali-soluble resin and a quinone diazide group-containing photosensitizer, for example a naphthoquinone diazide-type compound is conventionally and generally used. The positive-working photoresist composition using a novolak-type phenol resin as the alkali-soluble resin and a substituted naphthoquinone diazide compound as the photosensitizer is described in, for example, U.S. Pat. Nos. 3,666,473, 4,115,128 and 4,173,470. In these known positive-working photoresist compositions, the naphthoquinone diazide-type compound as the photosensitizer is used in an amount of usually 15 parts by weight or more, frequently 20 to 30 parts by weight relative to 100 parts by weight of the novolak-type phenol resin. However, when these known positive-working photoresist compositions are used as a photoresist composition and developed with the above-described known developing solution as a developing solution, the high sensitive photoresist particularly for TFT (thin film transistor) indicates poor film retention rate (due to too much reduction in film thickness), so there is near limit to attempt for further improvements in sensitivity of the photoresist. In addition, there arises another problem of high process dependency, that is, the characteristics of resist patterns formed vary significantly when treatment conditions in treatment processes are varied (accordingly, process tolerance is reduced).

For the purpose of conferring high sensitivity on the photoresist, it has been attempted to increase the concentration of an alkali in the developing solution or to prolong the developing time. However, if the concentration of an alkali in the developing solution is increased, the resist on unexposed areas shows significantly poor film retention rate, thus failing to attain sufficient resistance in the subsequent etching step, while if the development time is prolonged, there arises the problem of failing to achieve a sufficient effect on the so-called through-put (treatment efficiency per unit time). Further, it is also proposed to add various low-molecular components as the sensitizer. In this case, sensitivity can be improved, but the unexposed portion is easily dissolved in a developing solution together with an exposed area, resulting in a significant reduction in the film retention rate.

On the other hand, for the purpose of improving the resolution of the resulting resist patterns, it has been proposed to add a wide variety of additives such as surface active agents and organic compounds. Such photoresist compositions comprising surface active agents include those described in Japanese Patent Application Laid-Open (JP-A) Nos. 61-70551, 61-151537, 61-232454 and 62-32454, and those compositions comprising other organic compounds such as hydrocarbons in addition to surface active agents include those described in e.g. JP-A No. 62-232453. These compositions have both advantages and disadvantages, and none of these satisfy practically all of high resolution, high film retention rate and high dimension accuracy.

Under the circumstances described above, the object of the present invention is to provide a positive-working photoresist composition, a developing solution and a photolithography method comprising a combination thereof which can simultaneously achieve high sensitivity, a high film retention rate, high resolution, low process dependency, and a formation of excellent pattern profile, that is, can achieve high sensitivity while maintaining a high film retention rate and can form good patterns having high resolution and low dependency of dimensional accuracy in a photolithography method using a positive-working photoresist.

DISCLOSURE OF THE INVENTION

As a result of their eager study and examination, the present inventors found that the object described above can be achieved by a combination of a specific positive-working photoresist composition and a specific developing solution, thus completing the present invention.

That is, the present invention relates to a method of forming a minute resist pattern by use of a positive-working photoresist composition, wherein a photoresist composition comprising 3 to 15 parts by weight of a quinone diazide group-containing photosensitizer relative to 100 parts by weight of alkali-soluble novolak resin is used as the positive-working photoresist composition, and an aqueous organic or inorganic alkali solution having a lower alkali concentration than that of the conventional one is used as the developer.

In the present invention, as the developing solution, 2.2% by weight or less of an aqueous solution of a quaternary ammonium hydroxide represented by the general formula (1):

$$[(R^1)_3N\text{---}R^2]^+OH^- \qquad (1)$$

wherein $R^1$ represents an alkyl group having 1 to 3 carbon atoms, and $R^2$ represents an alkyl group having 1 to 3 carbon atoms or a hydroxy-substituted alkyl group having 1 to 3 carbon atoms, or 0.4% by weight or less of an aqueous solution of an inorganic hydroxide represented by the general formula (2):

$$MOH \qquad (2)$$

wherein M represents an alkali metal.

In the present invention, preferable examples of quaternary ammonium compounds represented by the general formula (1) above include tetramethyl ammonium hydroxide, tetraethyl ammonium hydroxide, tetrapropyl ammonium hydroxide, trimethylethyl ammonium hydroxide, trimethyl(2-hydroxyethyl) ammonium hydroxide, triethyl(2-hydroxyethyl) ammonium hydroxide, tripropyl(2-hydroxyethyl) ammonium hydroxide and trimethyl(2-hydroxypropyl) ammonium hydroxide. Particularly preferable examples among these are tetramethyl ammonium hydroxide (referred to hereafter as "TMAH") and trimethyl(2-hydroxyethyl) ammonium hydroxide (choline). Particularly preferable examples of inorganic hydroxides represented by the general formula (2) above are sodium hydroxide and potassium hydroxide.

To confer a buffering effect, the developing solution may contain carbonates or bicarbonates such as those of sodium or potassium as necessary. For the purpose of raising the permeability of the developing solution, surface active agents may also be contained therein.

Development with the developing solution of this invention may be conducted in any methods known in the art, such as immersion, spraying and paddling. The temperature, time etc. at the development may be suitably determined depending on the type of the photoresist composition used and the development method used.

The alkali-soluble novolak resin in the positive-working photoresist composition used in this invention is obtained by polycondensation of various phenols with aldehydes such as formaldehyde.

The phenols used include e.g. phenol, p-cresol, m-cresol, o-cresol, 2,3-dimethyl phenol, 2,4-dimethyl phenol, 2,5-dimethyl phenol, 2,6-dimethyl phenol, 3,4-dimethyl phenol, 3,5-dimethyl phenol, 2,3,4-trimethyl phenol, 2,3,5-trimethyl phenol, 3,4,5-trimethyl phenol, 2,4,5-trimethyl phenol, methylene bisphenol, methylene bis-p-cresol, resorcin, catechol, 2-methyl resorcin, 4-methyl resorcin, o-chlorophenol, m-chlorophenol, p-chlorophenol, 2,3-dichlorophenol, m-methoxyphenol, p-methoxyphenol, p-butoxyphenol, o-ethyl phenol, m-ethyl phenol, p-ethyl phenol, 2,3-diethyl phenol, 2,5-diethyl phenol, p-isopropyl phenol, α-naphthol and β-naphthol. These phenol compounds can be used alone or as a mixture thereof.

As the aldehydes, not only formaldehyde but also paraformaldehyde, acetaldehyde, benzaldehyde, hydroxybenzaldehyde, chloroacetaldehyde and the like can be used alone or as a mixture thereof.

The quinone diazide group-containing photosensitizer of the present invention may be any known one, and preferable examples include those produced by allowing naphthoquinone diazidosulfonic acid chloride or benzoquinone diazidosulfonic acid chloride to react with a low- or high-molecular compound containing a functional group capable of condensation reaction with acid chloride. The functional group capable of condensation reaction with the acid chloride includes a hydroxyl group, an amino group etc., among which a hydroxyl group is particularly preferable. The low-molecular compound containing hydroxyl group(s) includes e.g. hydroquinone, resorcin; polyhydroxybenzophenones such as 2,4-dihydroxybenzophenone, 2,3,4-trihydroxybenzophenone, 2,4,6-trihydroxybenzophenone, 2,4,4'-trihydroxybenzophenone, 2,3,4,4'-tetrahydroxybenzophenone, 2,2',4,4'-tetrahydroxybenzophenone and 2,2',3,4,6'-pentahydroxybenzophenone; bis((poly) hydroxyphenyl)alkanes such as bis(2,4-dihydroxyphenyl) methane, bis(2,3,4-trihydroxyphenyl) methane and bis(2,4-dihydroxyphenyl) propane-1; and polyhydroxytriphenylmethanes such as 4,4',3",4"-tetrahydroxy-3,5,3',5'-tetramethyltriphenylmethane, 4,4',2",3",4"-pentahydroxy-3,5,3',5'-tetramethyltriphenylmethane, and 2,3,4,2',3',4',3",4"-octahydroxy-5,5'-diacetyltriphenylmethane, while the high-molecular compound containing hydroxyl group(s) includes e.g. novolak resin, polyhydroxystyrene etc.

In the present invention, the proportion of the alkali-soluble novolak resin and the quinone diazide-containing photosensitizer is selected such that the latter is 3 to 15 parts by weight relative to 100 parts of the former.

If the amount of the latter is less than 3 parts by weight, the film retention rate after development with the low-conc. alkali developing solution of this invention is significantly lowered. On the other hand, if it is larger than 15 parts by weight, the film retention rate is improved, but the sensitivity is decreased. Therefore it is not practical. There is a quantitative relationship for maximizing the characteristics of the photoresist composition between the number of parts of the photosensitizer relative to the number of parts of the novolak resin and the concentration of the developing solution used therefor.

The solvent in which the alkali-soluble novolak resin and the photosensitizer in the present invention are dissolved includes ethylene glycol monoalkyl ethers such as ethylene glycol monomethyl ether and ethylene glycol monoethyl ether; ethylene glycol monoalkyl ether acetates such as ethylene glycol monomethyl ether acetate and ethylene glycol monoethyl ether acetate; propylene glycol monoalkyl ethers such as propylene glycol monomethyl ether and propylene glycol monoethyl ether; propylene glycol monoalkyl ether acetates such as propylene glycol monomethyl ether acetate and propylene glycol monoethyl ether acetate; lactates such as methyl lactate and ethyl lactate, aromatic hydrocarbons such as toluene and xylene; ketones such as methyl ethyl ketone, 2-heptanone and cyclohexanone; amides such as N,N-dimethylacetamide and N-methylpyrrolidone; and lactones such as γ-butyrolactone. These solvents are used singly or as a mixture thereof.

The positive-working photoresist composition of this invention can contain known additives such as dyestuffs, adhesive aids and surface active agents as necessary.

The dyestuffs include e.g. Methyl Violet, Crystal Violet, Malachite Green etc.; the adhesive aids include e.g. alkyl imidazoline, butyric acid, alkyl acid, polyhydroxystyrene, polyvinylmethyl ether, t-butyl novolak, epoxy silane, epoxy polymer, silane etc.; and the surface active agents include e.g. nonionic surface active agents such as polyglycols and derivatives thereof, that is, polypropylene glycol or polyoxyethylene lauryl ether, fluorine-containing surface active agents such as Fluorad (Sumitomo 3M Ltd.), Megafac (Dainippon Ink and Chemicals, Inc.), Sulflon (Asahi Glass Co., Ltd.) or organic siloxane surface active agents such as KP341 (Shin-Etsu Chemical Co., Ltd.).

Hereinafter, the present invention is described in more detail by reference to the Examples, which however are not intended to limit the present invention.

BEST MODE FOR CARRYING OUT THE INVENTION

SYNTHESIS EXAMPLE 1

Synthesis of Novolak Resin 56 parts by weight of 37 weight % formaldehyde and 2 parts by weight of oxalic acid were incorporated into 100 parts by weight of a cresol mixture composed of m-cresol and p-cresol at a mixing ratio of 6/4, and the mixture obtained was allowed to react at 100° C. for 5 hours. The molecular weight of the novolak resin obtained was 15,200 as determined using polystyrene standards.

SYNTHESIS EXAMPLE 2

Photosensitizer Synthesis 1

2,3,4,4'-tetrahydroxybenzophenone and 1,2-naphthoquinonediazido -5-sulfonyl chloride were dissolved at a compounding ratio (molar ratio) of 1/2.5 in dioxane and esterified in a usual manner with triethylamine as a catalyst. The esters formed were measured by HPLC to indicate 5% monoester, 42% diester, 13% triester and 39% tetraester.

SYNTHESIS EXAMPLE 3

Photosensitizer Synthesis 2

2,3,4-trihydroxybenzophenone and 1,2-naphthoquinonediazido -5-sulfonyl chloride were dissolved at a compounding ratio (molar ratio) of 1/2.0 in dioxane and esterified in a usual manner with triethylamine as a catalyst. The esters formed were measured by HPLC to indicate 29% diester and 63% triester.

EXAMPLES 1 TO 7

The novolak resin obtained in Synthesis Example 1 and the photosensitizer obtained in Synthesis Example 2 were dissolved respectively in propylene glycol monomethyl ether acetate at each proportion shown in Table 1. To prevent radial wrinkles formed on a resist film upon spin coating i.e. the so-called striation, the fluorine-based surface active agent Fluorad F-472 (Sumitomo 3M Ltd.) was added thereto at 500 ppm, then the resulting solutions were stirred and filtered through a 0.2 μm filter to prepare positive-working photoresist compositions of the present invention. Each composition was spin-coated on a 4-inch silicon wafer and baked at 100° C. for 90 seconds on a hot plate to give a resist film of 1.5 μm in thickness. This resist film was exposed using a g-line stepper, DSW6400 (NA=0.42) manufactured by GCA Ltd. through a test pattern having various line width patterns with line and space width of 1:1, and then developed for 60 seconds with a developing solution consisting of an aqueous TMAH solution at a concentration shown in Table 1.

After development, the amount of exposure energy with which 3 μm line and space were resolved into 1:1 was assumed to be sensitivity, while the rate of the film thickness on the unexposed area divided by the initial film thickness (1.5 μm), was assumed to be the film retention rate, and further the 3 μm line was observed under a scanning electron microscope (SEM), to give the results in Table 1.

In recent years, tact time is important for producing flat panel displays, particularly for producing TFT system panels. For meeting the demand, the use of higher sensitive photoresist is essential, and it is essential for the sensitivity of the photoresist to be 20 mJ/cm$^2$ or less. Simultaneously, a higher film retention rate is more preferable, and it should be at least 90% or more. The resist line shape is preferably perpendicular, and the space portion is required to be free of residues such as scum.

Any combinations of the composition and the development conditions of the present invention shown in Examples 1 to 7 brought about a high sensitivity of 16 mJ/cm$^2$ or less and a film retention rate of 98% or more. Further, the shape of 3 μm resist line was perpendicular and there are no residues such as scum in the space portion, the examples of the present invention indicating ideal resist characteristics.

Comparative Examples 1 to 5

Resist patterns were formed in the same manner as in Examples 1 to 7 except for the respective conditions shown in "Comparative Examples 1 to 5" in Table 1, and resist characteristics thereof were examined. The results are shown in Table 1.

Both the proportions of the photosensitizer in the resist compositions and the alkali concentrations in the developing solutions in Comparative Examples 1 to 5 were within the range in the prior art. In Comparative Example 4, which was considered optimum for sensitivity and film retention among Comparative Examples 1 to 5 as shown in Table 1, the sensitivity was 20 mJ/cm$^2$ and the film retention rate was 94%, but these were considerably inferior to those in Examples 1 to 7. Further, the resist line was in a relatively mountain-shaped form because of the low film retention rate.

Comparative Examples 6 to 9

Resist films were formed in the same manner as in Examples 1 to 7 except for the respective conditions shown in "Comparative Examples 6 to 9" in Table 1, and resist characteristics were examined. The results are shown in Table 1.

In Comparative Examples 6 to 9, the alkali concentrations in the developing solutions were within the range of the present invention, but the proportions of the photosensitizer in the resist compositions were within the range in the prior art. As can be seen from Table 1, when the amount of the photosensitizer was 17 parts by weight or more which was more than 15 parts by weight, high film retention rate were attained, but the sensitivity was worsened to be 20 mJ/cm$^2$ or more. Further, when the amount of the photosensitizer was 25 parts by weight, the resist line was in a mountain-shaped (trailing) form, and when it reached 30 parts by weight, the lines could not be distinguished from one another without being resolved.

Comparative Example 10

Resist patterns were formed in the same manner as in Examples 1 to 7 except for the conditions shown in "Comparative Example 10" in Table 1, and resist characteristics thereof were examined. The results are shown in Table 1.

In Comparative Example 10, the alkali concentration in the developing solution was within the range in the present invention, but the proportion of the photosensitizer in the resist composition was 2% by weight which was lower than 3% by weight i.e. the lower limit of the present invention. When the proportion of the photosensitizer was less than 3% by weight outside of the range of the present invention, the film retention rate was significantly lowered as is evident from Table 1.

Comparative Examples 11 and 12

Resist patterns were formed in the same manner as in Examples 1 to 7 except for the respective conditions shown in "Comparative Examples 11 and 12" in Table 1, and resist characteristics thereof were examined. The results are shown in Table 1.

In Comparative Examples 11 and 12, the proportions of the photosensitizer in the resist compositions were within the range of the present invention, but the developing solutions were conventional aqueous high-conc. alkali solutions. As is evident from Table 1, when the conventional aqueous high-conc. alkali solution was used, the all of resist film was dissolved to fail to function as a resist even if the proportion of the photosensitizer was in the range of this invention.

TABLE 1

| | Novolak resin/ Potosensitizer (ratio by weight) | Developing solution TMAH (weight %) | Sensitivity (mJ/cm²) | Film retention rate (%) | Observation under SEM (3 μm line) |
|---|---|---|---|---|---|
| Example | | | | | |
| 1 | 100/3 | 1.90 | 7 | 98 | Perpendicular |
| 2 | 100/6 | 1.90 | 10 | 98 | Perpendicular |
| 3 | 100/9 | 1.90 | 12 | 98 | Perpendicular |
| 4 | 100/12 | 1.90 | 15 | 99 | Perpendicular |
| 5 | 100/15 | 1.90 | 16 | 99 | Perpendicular |
| 6 | 100/9 | 2.20 | 10 | 98 | Perpendicular |
| 7 | 100/9 | 1.70 | 15 | 99 | Perpendicular |
| Comparative Example | | | | | |
| 1 | 100/17 | 2.38 | — | 0 | No residues of film |
| 2 | 100/20 | 2.38 | 12 | 48 | Mountain-shaped form |
| 3 | 100/25 | 2.38 | 16 | 92 | Mountain-shaped form approaching perpendicular |
| 4 | 100/27 | 2.38 | 20 | 94 | Mountain-shaped form approaching perpendicular |
| 5 | 100/30 | 2.38 | 32 | 98 | Scum |
| 6 | 100/17 | 1.90 | 21 | 99 | Perpendicular |
| 7 | 100/20 | 1.90 | 27 | 99 | Perpendicular |
| 8 | 100/25 | 1.90 | 48 | 99 | Trailing |
| 9 | 100/30 | 1.90 | Not resolved | 99 | Not resolved |
| 10 | 100/2 | 1.90 | 3 | 67 | No chapping on the surface |
| 11 | 100/9 | 2.50 | — | 0 | No residues of film |
| 12 | 100/9 | 2.38 | — | 0 | No residues of film |

EXAMPLES 8 TO 14

Resist patterns were formed in the same manner as in Examples 1 to 7 except that a mixture consisting of the novolak resin obtained in Synthesis Example 1 and the photosensitizer obtained in Synthesis Example 3 at each ratio shown in Table 2 was used as the resist composition, and that the developing solution containing NaOH at each concentration shown in Table 2 was used as the developing solution, and resist characteristics thereof were examined. The results are shown in Table 2.

As shown in Table 2, any resist films indicated a high sensitivity of 20 mJ/cm² or less and a film retention rate of 98% or more. Further, the shape of 3 μm resist line was perpendicular, and there are no residues such as scum in the space portion, the examples of the present invention indicating ideal resist.

Comparative Examples 13 to 17

Resist patterns were formed in the same manner as in Examples 1 to 7 except for the respective conditions shown in "Comparative Examples 13 to 17" in Table 2, and resist characteristics thereof were examined. The results are shown in Table 2.

In Comparative Examples 13 to 17, both the proportions of the photosensitizer in the resist compositions and the alkali concentrations in the developing solutions were within the range in the prior art. As is evident from Table 2, when the proportion of the photosensitizer was 17 parts by weight, neither high sensitivity nor high film retention rate could be achieved. Further, when the proportion of the photosensitizer was more than 25 parts by weight, scum was generated and thus not preferable.

Comparative Examples 18 to 21

Resist patterns were formed in the same manner as in Examples 1 to 7 except for the respective conditions shown in "Comparative Examples 18 to 21" in Table 2, and resist characteristics thereof were examined. The results are shown in Table 2.

In Comparative Examples 18 to 21, the alkali concentrations in the developing solutions were within the range of this invention, but the proportions of the photosensitizer in the resist compositions were within the range in the prior art. As is evident from Table 2, when the proportion of the photosensitizer was 17 parts by weight or more which was more than 15 parts by weight, high film retention rate were achieved, but the sensitivity was lowered. Further, when the proportion of the photosensitizer was 25 parts by weight, scum was observed, and when it reached 30 parts by weight, the lines could not be distinguished from one another without being resolved.

Comparative Example 22

Resist patterns were formed in the same manner as in Examples 1 to 7 except for the conditions shown in "Comparative Example 22" in Table 2, and resist characteristics thereof were examined. The results are shown in Table 2.

In Comparative Example 22, the alkali concentration in the developing solution was within the range of this invention, but the proportion of the photosensitizer in the resist composition was 2 parts by weight lower than 3 parts by weight i.e. the lower limit of this invention. As is evident from Table 2, when the proportion of the photosensitizer was less than 3 parts by weight outside of the range of this invention, the film retention rate was significantly lowered, and the resist line was in a mountain-shaped form.

Comparative Examples 23 and 24

Resist patterns were formed in the same manner as in Examples 1 to 7 except for the respective conditions shown in "Comparative Examples 23 and 24" in Table 2, and resist characteristics thereof were examined. The results are shown in Table 2.

In Comparative Examples 23 and 24, the proportions of the photosensitizer in the resist compositions were within the range of the present invention, but the developing solutions were conventional aqueous high-conc. alkali solutions. As is evident from Table 2, when the proportion of the photosensitizer was in the range of this invention but the conventional aqueous high-conc. alkali solution was used as the developing solution, the resist film was easily dissolved during development and the whole film was dissolved in 0.75 weight % aqueous NaOH, and the film retention rate was significantly lowered in 0.5 weight % aqueous NaOH to form a mountain-shaped resist line.

TABLE 2

| Example | Novolak resin/ Potosensitizer (ratio by weight) | Developing solution NaOH (weight %) | Sensitivity (mJ/cm$^2$) | Film retention rate (%) | Observation under SEM (3 μm line) |
|---|---|---|---|---|---|
| 8 | 100/3 | 0.30 | 9 | 98 | Perpendicular |
| 9 | 100/6 | 0.30 | 11 | 99 | Perpendicular |
| 10 | 100/9 | 0.30 | 14 | 100 | Perpendicular |
| 11 | 100/12 | 0.30 | 17 | 100 | Perpendicular |
| 12 | 100/15 | 0.30 | 20 | 100 | Perpendicular |
| 13 | 100/9 | 0.40 | 12 | 99 | Perpendicular |
| 14 | 100/9 | 0.20 | 17 | 100 | Perpendicular |
| Comparative Example | | | | | |
| 13 | 100/17 | 0.50 | 28 | 89 | Perpendicular |
| 14 | 100/20 | 0.50 | 45 | 96 | Perpendicular |
| 15 | 100/25 | 0.50 | 59 | 99 | Scum |
| 16 | 100/27 | 0.50 | 88 | 100 | Scum |
| 17 | 100/30 | 0.50 | Not resolved | 100 | Scum |
| 18 | 100/17 | 0.30 | 31 | 95 | Perpendicular |
| 19 | 100/20 | 0.30 | 56 | 99 | Perpendicular |
| 20 | 100/25 | 0.30 | 69 | 99 | Scum |
| 21 | 100/30 | 0.30 | Not resolved | 100 | Not resolved |
| 22 | 100/2 | 0.30 | 6 | 79 | Mountain-shaped form |
| 23 | 100/9 | 0.75 | — | 0 | No residues of film |
| 24 | 100/9 | 0.50 | 3 | 44 | Moutain-shaped form |

EXAMPLE 15

By using the same resist composition, the same developing solution and the same treatment conditions as in Example 4, the minimum resolved line width smaller than 3 μm line was determined by observation under SEM. The results are shown in Table 3. The pattern was resolved until 0.5 μm.

EXAMPLES 16 TO 18

The same resist composition and the same developing solution as in Example 15 were used, and the process dependency was determined using prolonged developing times of 80 seconds, 100 seconds and 120 seconds, respectively. The results are shown in Table 3. As is evident from Table 3, both the reduction in the film retention rate and the alternation in line width by prolonging the developing time were very small.

Comparative Example 25

Resist patterns were formed in the same manner as in Example 15 except that the proportion of the photosensitizer and the concentration of the developing solution were within the range in the prior art, and that the conditions (the proportion of the photosensitizer, 25% by weight; the concentration of the developing solution, 2.38% by weight) shown in "Comparative Example 25" in Table 3 by which the same sensitivity as in Example 15 was attained were used, and resist characteristics thereof were examined. The results are shown in Table 3. The minimum degree of resolution of the resulting resist pattern was 0.9 μm, and the film retention rate was 92%, thus indicating significantly inferior characteristics to those in Example 15.

Comparative Examples 26 to 28

The same procedure as in Comparative Example 25 was repeated except that the developing time was changed to 80 seconds, 100 seconds and 120 seconds respectively, and the dependency on development time was examined by the procedure. The results are shown in Table 3.

From the results of Comparative Example 25 and Comparative Examples 26 to 28 in Table 3, when the resist compositions and the developing solutions within the scope of the prior art were used, the degree of fluctuation of sensitivity, the reduction of the film retention rate, and the thinning of line width became significantly worse as the development time was increased, as compared with those in Example 16 to 18.

TABLE 3

| | Novolak resin/ Photosesnsitizer (ratio by weight) | Developing solution NaOH (weight %) | time (sec.) | Sensitivity (mJ/cm$^2$) | Film retention rate (%) | Minimum line width resolved (μm) | Resist line width formed from 3 μm mask line (μm) |
|---|---|---|---|---|---|---|---|
| Example | | | | | | | |
| 15 | 100/12 | 1.90 | 60 | 15.3 | 99 | 0.5 | 3.00 |
| 16 | 100/12 | 1.90 | 80 | 14.3 | 99 | — | 2.94 |
| 17 | 100/12 | 1.90 | 100 | 13.6 | 98 | — | 2.89 |
| 18 | 100/12 | 1.90 | 120 | 12.7 | 97 | — | 2.83 |
| Comparative Example | | | | | | | |
| 25 | 100/25 | 2.38 | 60 | 15.8 | 92 | 0.9 | 3.00 |
| 26 | 100/25 | 2.38 | 80 | 11.5 | 77 | — | 2.77 |
| 27 | 100/25 | 2.38 | 100 | 8.1 | 62 | — | 2.50 |
| 28 | 100/25 | 2.38 | 120 | 6.3 | 45 | — | 2.19 |

EXAMPLE 19

The same procedure as in Example 4 was repeated except that the resist was applied to a natural oxide film of Mo on a 4-inch silicon wafer which had been prepared by forming a Mo film on the 4-inch silicon wafer and then leaving it for 1 week in a clean room, instead of to a 4-inch silicon wafer, and resist patterns were formed on said Mo oxide film. The sensitivity of the resulting patterns, the film retention rate and the adhesion of the resist patterns to the natural Mo oxide film were observed. The results are shown in "Example 19" in Table 4. It is known that an Mo film just after being produced forms a natural oxide film thereon. And it is also known that as is soluble in an aqueous alkali solution, the oxide film of Mo is dissolved in the resist developing solution to cause the inconvenience of washing away the resist film. In this example, however, the whole of the resist patterns adhered strongly to the Mo oxide film, possibly because the power of dissolving the Mo oxide of the developing solution was weak due to its low concentration.

EXAMPLE 20

The same procedure as in Example 7 was repeated except that the resist was applied to a natural oxide film of Mo on a 4-inch silicon wafer which had been prepared by forming a Mo film on the 4-inch silicon wafer and then leaving it for 1 week in a clean room, instead of to a 4-inch silicon wafer, and resist patterns were formed on said Mo oxide film in the same manner as Example 19. The sensitivity of the resulting patterns, the film retention rate and the adhesion of the resist patterns to the natural oxide film of Mo were observed. The results are shown in "Example 20" in Table 4. Even if the proportion of novolak resin/photosensitizer and the development conditions used were different from those in Example 19, the whole of the resist patterns adhered strongly to the natural Mo oxide film in a similar manner to Example 19, as is evident from Table 4.

Comparative Example 29

The test was conducted in the same manner as in Example 19 except that the proportion of novolak resin/photosensitizer and the development conditions were changed. The results are shown in Table 4. As shown in Table 4, resist line patterns of 10 μm or more remained but thinner line patterns than 10 μm were washed away, probably because the developing solution had a high alkali concentration to cause dissolution of Mo oxide.

conventional one, whereby a resist pattern with high sensitivity and high film retention rate can be formed. The developing solution of this invention can inhibit the thinning of resist film, thus providing a photoresist excellent in residual film thickness after development. However If the conventional photoresist composition containing a higher proportion of the photosensitizer than in the present invention is developed by the developing solution of this invention, there arises the problem of causing a reduction in sensitivity to the contrary, and causing generation of scum or the like. In view of this, the effect of the present invention described above is unpredictable. Further, according to the method of forming patterns in the present invention, the unpredictable effect of reducing process dependency is also demonstrated at the same time, and patterns with excellent pattern profile, no residues after development and high resolution can also be formed. Further, in the present invention, the proportion of the photosensitizer used in the photoresist composition is so low that the amount of the expensive photosensitizer can be reduced. In addition, as the developing solution with a low alkali content is used, the amount of the raw materials consumed can be reduced to bring about economical profits. Further, in the case where photoresist patterns are formed on a readily air-oxidized alkali-soluble metal film such as molybdenum (Mo), the effect of preventing the patterns from being washed away due to dissolution of the metal oxide film during development can also be demonstrated.

Industrial Applicability

The method of forming a minute resist pattern according to the present invention can be applied preferably as a method of forming a minute resist pattern in manufacturing integrated circuits, liquid crystal display faces for LCD (liquid crystal display) etc. and particularly in preparing liquid crystal display faces for LCD of the TFT system.

What is claimed is:

1. A method of forming a minute resist pattern, comprising forming a coating of a positive photoresist composition containing a quinone diazide group-containing photosensitizer in an amount of 3 to 15 parts by weight relative to 100

TABLE 4

| | Novolak resin/ Photosensitizer (ratio by weight) | Developing solution TMAH (weight %) | time (sec.) | Sensitivity (mJ/cm$^2$) | Film retention rate (%) | Resist pattern on the naturaly oxidized film of Mo |
|---|---|---|---|---|---|---|
| Exxample | | | | | | |
| 19 | 100/12 | 1.90 | 60 | 15.3 | 99 | The whole of the resist patterns were adhered |
| 20 | 100/9 | 1.70 | 60 | 15.4 | 99 | The whole of the resist patterns were adhered |
| Comparative Example 29 | 100/25 | 2.38 | 60 | 15.7 | 92 | Line patters under 10 μm were washed away |

Effect of the Invention

In the method of forming a minute resist pattern according to the present invention, the ratio of the quinone diazide group-containing photosensitizer to the alkali-soluble novolak resin in the positive-working photoresist composition is made lower than that in the prior art, and a positive-working photoresist composition having a lower ratio of the quinone diazide group-containing photosensitizer is used as a photoresist composition and developed with the developing solution having a lower content of an alkali than in parts by weight of alkali-soluble novolak resin, imagewise exposing the photoresist coating, and developing the photoresist coating using a developer consisting essentially of 2.2 % by weight or less aqueous solution of a quaternary ammonium hydroxide represented by the general formula (1):

$$[(R^1)_3N-R^2]^+OH^- \quad (1)$$

wherein $R^1$ represents an alkyl group having 1 to 3 carbon atoms, and $R^2$ represents an alkyl group having 1 to 3 carbon atoms or a hydroxy-substituted alkyl group having 1 to 3 carbon atoms; furthermore where the alkali-soluble novolak resin consists essentially of the reaction product of at least one aldehyde with compounds selected from a group consisting of monohydroxybenzene, substituted monohydroxybenzenes, naphthols and mixtures thereof.

2. A method of forming a minute resist pattern according to claim 1, wherein the quaternary ammonium hydroxide represented by the general formula (1) is tetramethyl ammonium hydroxide, tetraethyl ammonium hydroxide, or trimethyl(2-hydroxyethyl) ammonium hydroxide, and one or more of the above are contained in the developer.

3. The method according to claim 1 where the positive photoresist is characterized by having an exposure dose of less than 20 mJ/cm$^2$ for a coating of 1.5 microns.

4. The method according to claim 1 where the developer further comprises one or more additives selected from carbonates, bicarbonates, surface active agents or mixtures thereof.

5. A method of forming a minute resist pattern according to claim 1, where the substituted monohydroxybenzenes are selected from a group consisting of cresols, dimethyl phenols, trimethyl phenols, methylene bisphenols, chlorophenols, dichlorophenols, methoxy phenols, ethoxy phenols, butoxyphenols, ethyl phenols and propyl phenols.

6. A method of forming a minute resist pattern according to claim 1, where the aldehyde is selected from a group consisting of formaldehyde, paraformaldehyde, acetaldehyde, benzaldehyde, hydroxybenzaldehyde, chloroacetaldehyde, and mixtures thereof.

* * * * *